(12) United States Patent
Takahashi et al.

(10) Patent No.: US 10,559,450 B2
(45) Date of Patent: Feb. 11, 2020

(54) SCANNING ELECTRON MICROSCOPE

(71) Applicant: Hitachi High-Technologies Corporation, Tokyo (JP)

(72) Inventors: Noritsugu Takahashi, Tokyo (JP); Yasunari Sohda, Tokyo (JP); Akira Ikegami, Tokyo (JP); Yuta Kawamoto, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 16/115,287

(22) Filed: Aug. 28, 2018

(65) Prior Publication Data

US 2019/0074159 A1 Mar. 7, 2019

(30) Foreign Application Priority Data

Sep. 1, 2017 (JP) .................. 2017-168435

(51) Int. Cl.
*H01J 37/141* (2006.01)
*H01J 37/04* (2006.01)
(Continued)

(52) U.S. Cl.
CPC ............ *H01J 37/28* (2013.01); *H01J 37/141* (2013.01); *H01J 37/1475* (2013.01);
(Continued)

(58) Field of Classification Search
CPC .................. H01J 37/244; H01J 37/265; H01J 2237/2448; H01J 37/141; H01J 37/147; H01J 2237/082; H01J 2237/1508; H01J 2237/2806; H01J 37/226; H01J 2237/151; H01J 2237/152; H01J 2237/248;
(Continued)

(56) References Cited

U.S. PATENT DOCUMENTS 6,172,363 B1 * 1/2001 Shinada ............... G01R 31/305
250/307
6,583,413 B1 * 6/2003 Shinada ............... G01N 23/225
250/306

(Continued)

FOREIGN PATENT DOCUMENTS

JP 2012-003902 A 1/2012

*Primary Examiner* — David A Vanore
(74) *Attorney, Agent, or Firm* — Miles & Stockbridge, P.C.

(57) ABSTRACT

The present invention enlarges a range of movement of field of view by beam deflection with a simple deflector configuration and suppresses deterioration of a signal electron detection rate caused by the beam deflection. A scanning electron microscope according to the present invention is provided with a first deflection field setting module that sets plural deflectors to move a scanning area on a specimen by a primary electron beam to a position deviated from an axis extended from an electron source toward the center of an objective lens and a second deflection field setting module that sets the plural deflectors so that trajectories of signal electrons are corrected without changing the scanning area set by the first deflection field setting module. The control unit controls the plural deflectors by adding a setting value set by the second deflection field setting module to a setting value set by the first deflection field setting module.

12 Claims, 9 Drawing Sheets

(51) Int. Cl.
*H01J 37/28* (2006.01)
*H01J 37/244* (2006.01)
*H01J 37/147* (2006.01)

(52) U.S. Cl.
CPC ........ *H01J 37/1477* (2013.01); *H01J 37/244* (2013.01); *H01J 2237/2817* (2013.01)

(58) Field of Classification Search
CPC .. H01J 37/04; H01J 37/05; H01J 37/12; H01J 37/1472; H01J 37/1475; H01J 37/1477; G01N 23/2251; G01N 23/225
USPC ......... 250/310, 307, 306, 311, 309, 396 ML, 250/399, 442.11, 492.21, 492.22
See application file for complete search history.

(56) References Cited

U.S. PATENT DOCUMENTS

| | | | | |
|---|---|---|---|---|
| 7,633,063 | B2* | 12/2009 | Takane | H01J 37/1471 250/306 |
| 7,655,906 | B2* | 2/2010 | Cheng | G01N 23/2251 250/306 |
| 7,683,319 | B2* | 3/2010 | Makino | H01J 37/026 250/310 |
| 8,153,969 | B2* | 4/2012 | Fukada | G01N 23/2251 250/306 |
| 2002/0109088 | A1* | 8/2002 | Nara | G03F 7/70616 250/306 |
| 2006/0163477 | A1* | 7/2006 | Nozoe | G01R 31/307 250/310 |
| 2006/0251318 | A1* | 11/2006 | Gunji | G01N 23/203 382/147 |
| 2006/0284088 | A1* | 12/2006 | Fukunaga | H01J 37/21 250/310 |
| 2008/0067371 | A1* | 3/2008 | Kurihara | G01N 21/9501 250/307 |
| 2008/0237465 | A1* | 10/2008 | Hatano | G01N 23/225 250/311 |
| 2008/0319696 | A1* | 12/2008 | Tanaka | H01J 37/222 702/97 |
| 2009/0208091 | A1* | 8/2009 | Hayakawa | G01N 21/956 382/149 |
| 2011/0274341 | A1* | 11/2011 | Shirahata | G01B 15/00 382/145 |
| 2015/0357155 | A1* | 12/2015 | Dohi | H01J 37/147 250/307 |
| 2015/0364290 | A1* | 12/2015 | Enyama | H01J 37/1478 250/396 ML |
| 2016/0217967 | A1* | 7/2016 | Dohi | H01J 37/141 |
| 2016/0379795 | A1* | 12/2016 | Watanabe | H01J 37/21 250/310 |
| 2017/0092459 | A1* | 3/2017 | Takahashi | H01J 37/05 |
| 2018/0190469 | A1* | 7/2018 | Cheng | H01J 37/153 |

* cited by examiner

SCANNING ELECTRON MICROSCOPE

CROSS-REFERENCE TO RELATED APPLICATION

This application claims priority to Japanese Patent Application No. 2017-168435 filed on Sep. 1, 2017, the entire contents of which are incorporated by reference herein.

BACKGROUND

The present invention relates to technique for measuring and inspecting a microfabricated circuit pattern and others using an electron beam.

A scanning electron microscope is an apparatus that focuses a primary electron beam emitted from an electron source by an electromagnetic lens, detects a signal electron such as a secondary electron and a backscattered electron respectively emitted from a specimen in scanning and irradiating the primary electron beam on a surface of the specimen by electromagnetic deflection, and acquires an image. As the scanning electron microscope can acquire an image of higher resolution by focusing the primary electron beam, compared with an optical microscope, the scanning electron microscope is applied to semiconductor metrology equipment used for measuring dimensions of a microfabricated circuit pattern in a semiconductor manufacturing process and others. In addition, recently, large field inspection of a pattern formed on a semiconductor wafer becomes more important and inspection equipment that precisely executes the large field inspection is demanded. In the large field inspection of the semiconductor pattern dimensions by the scanning electron microscope, high throughput is required in addition to similar resolution to the semiconductor metrology equipment.

In the semiconductor metrology equipment using the scanning electron microscope, movement of field of view (FOV) by driving stage in XY directions, operation for acquiring an image at a measurement location and measuring dimensions of a pattern are executed sequentially, and this series of operation is repeated. When this operation is applied to large field inspection of the semiconductor pattern, repeating the movement of FOV by the driving the stage causes a bottleneck of throughput. Therefore, if a movement range of FOV by primary electron beam deflection (hereinafter called beam deflection) can be enlarged, a frequency of stage movement can be reduced and throughput can be enhanced.

In the meantime, it is important, so as to precisely measure dimensions of a semiconductor pattern with movement of FOV by primary electron deflection, that detection of signal electron of an image is uniformly acquired in an area of beam deflection. Generally, the scanning electron microscope with high resolution has a through the lens (TTL) detection system in which signal electrons emitted from a specimen is detected after passing through the objective lens. In the TTL detection system, signal electrons are acted refraction by the objective lens and deflection by the deflection field like primary electron beam. As a result, the signal electron collides with an optical component such as a deflector before the signal electrons reach the detector and a detection rate of signal electrons varies depending on beam deflection range. To avoid this situation, a means for controlling a trajectory of signal electrons is required.

For the unit that controls a trajectory of signal electrons, Wien filter is known. In the scanning electron microscope, the Wien filter is generally used for a deflector in which deflection fields of an electrostatic field and a magnetic field are superimposed so as to cancel deflection of the primary electron beam and to deflect only a signal electron. For example, for technique for generating a deflection field that deflects only a signal electron without deflecting a primary electron beam, Japanese Unexamined Patent Application Publication No. 2012-3902 can be given. In Japanese Unexamined Patent Application Publication No. 2012-3902, a deflector used for movement of FOV by beam deflection is configured by Wien filter and a deflection field that deflects only a signal electron without deflecting a primary electron beam in the deflector is superimposed on a deflection field of the primary electron beam.

SUMMARY

As described above, in an optical system in which a signal electron emitted from a specimen is detected by a detector after passing an objective lens, when a scanning area of a primary electron beam on the specimen is moved by deflection of the primary electron beam, signal electrons that collide with structure before reaching the detector increase and a signal electron detection rate is deteriorated depending on a beam deflection amount of the primary electron.

In the configuration disclosed in Japanese Unexamined Patent Application Publication No. 2012-3902, as it is necessary to generate the deflection field that is superimposed electrostatic field and magnetic field of similar distribution to deflect the signal electron and not to deflect primary electron, it becomes difficult to design and control of the deflector with such a configuration. In addition, in this configuration, as the primary electron beam deviates from the axis at the deflector and passes the Wien filter, aberration is caused by a higher harmonic component of electrostatic deflection field and further intricate control is required to correct this aberration.

An object of the present invention is to provide a charged particle beam apparatus that controls a signal electron in a simple deflector configuration and suppresses deterioration of a detection rate caused by deflection field when a movement range of FOV is enlarged by primary electron beam deflection.

Representative examples of the present invention disclosed in this application are as follows. In a scanning electron microscope with an electron source, a condenser lens and an objective lens respectively for focusing a primary electron beam emitted from the electron source on a specimen, plural deflectors that deflect the primary electron beam passing the condenser lens, a detector that detects a signal electron emitted from the specimen by scanning of the primary electron beam to the specimen, and a control unit that controls the electron source, the condenser lens, the objective lens and the plural deflectors, wherein the control unit is provided with a first deflection field setting module that sets the plurality of deflectors so as to move a scanning area on the specimen by the primary electron beam to a position deviated from an axis extended from the electron source toward the center of the objective lens and a second deflection field setting module that sets the plurality of deflectors so as to correct trajectories of signal electrons without changing the scanning area determined by the first deflection field setting module; and the control unit controls the plurality of deflectors by adding a setting value set by the second deflection field setting module to a setting value set by the first deflection field setting module.

A movement range of FOV with beam deflection can be enlarged with the simple deflector configuration and the deterioration of the signal electron detection rate caused by beam deflection is suppressed.

DETAILED DESCRIPTION

First Embodiment

Figure 1:
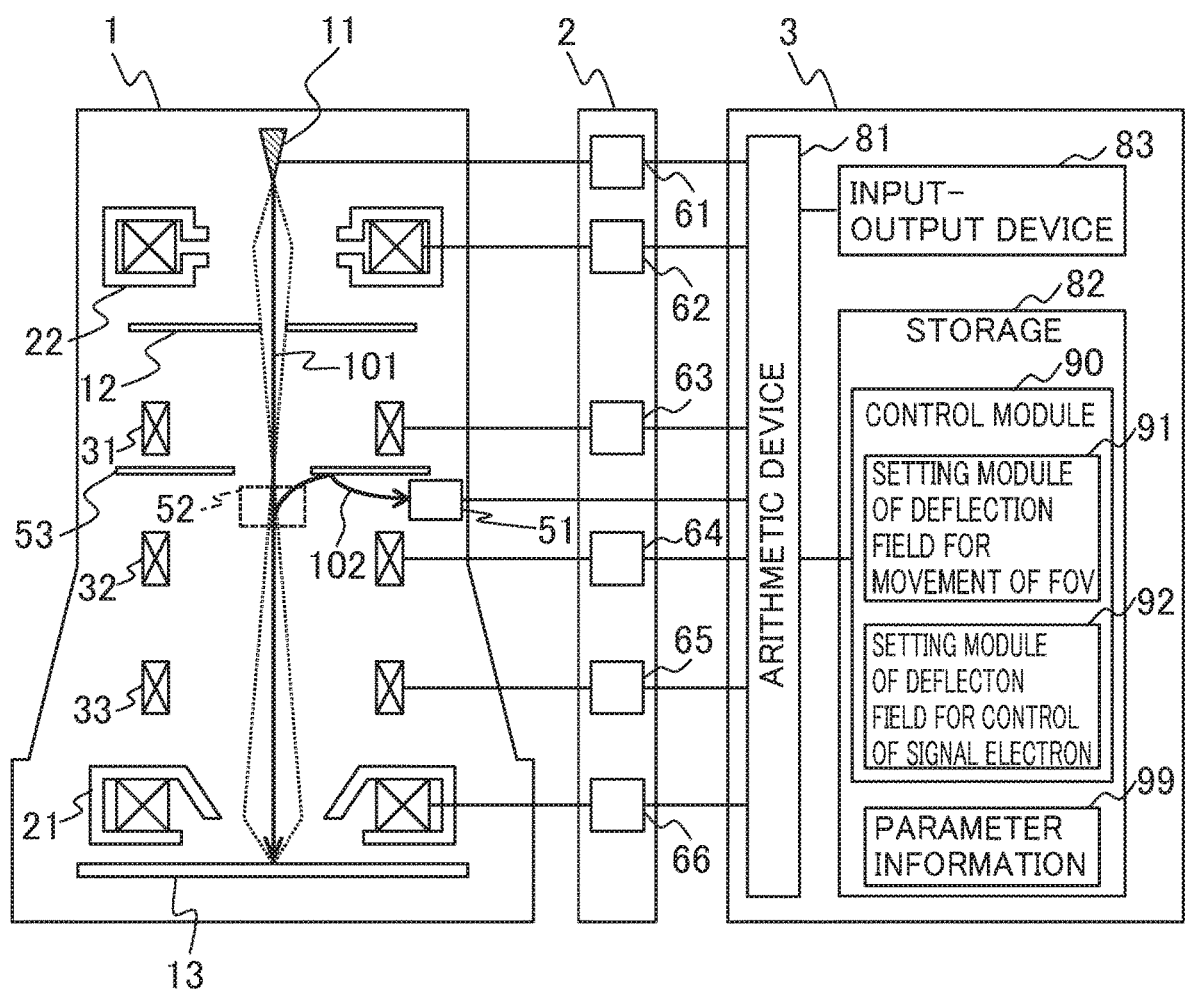
FIG. 1 is a schematic diagram showing an overall constitution of a scanning electron microscope equivalent to a first embodiment.

FIG. 1 is a schematic diagram showing an overall constitution of a scanning electron microscope equivalent to a first embodiment. The scanning electron microscope is provided with an electro-optical column 1, a power unit 2 and a control unit 3. The power unit 2 supplies voltage and current to each component of the electro-optical column 1 and includes control power sources 61 to 66 of each component. The control power source 61 is provided so as to control applied voltage to an electron source 11. In addition, the control power sources 62, 63, 64, 65, 66 are provided so as to control current applied to each coil of a condenser lens 22, a first deflector 31, a second deflector 32, a third deflector 33 and an objective lens 21.

The control unit 3 controls the whole scanning electron microscope. The control unit 3 may also include a storage medium such as a hard disk drive (HDD) and a solid state drive (SSD).

An arithmetic device 81 executes a predetermined arithmetic process according to a program stored in a storage 82. For the arithmetic device 81, a central processing unit (CPU) and a graphics processing unit (GPU) are conceivable for example.

The storage 82 stores programs executed by the arithmetic device 81 and data used by the programs. The storage 82 includes a temporary memory area such as a work area used by the program. The programs and data stored in the storage 82 will be described later.

An input-output device 83 inputs/outputs data. The input-output device 83 includes a keyboard, a mouse, a touch panel, a display and others.

In the electro-optical column 1, the electron source 11, the detector 51, the aperture 12, the objective lens 21, the condenser lens 22, the first deflector 31, the second deflector 32, the third deflector 33, the ExB deflector 52 and the stage (not shown) are installed, and the specimen 13 to be observed is placed on the stage. In an example shown in FIG. 1, the first, the second and the third deflectors 31, 32, 33 are all the deflector using a magnetic field.

In the electro-optical column 1, a primary electron beam 101 is emitted from the electron source 11. The primary electron beam 101 is focused on the specimen 13 through the condenser lens 22 and the objective lens 21 in order. That is, the focal plane of the primary electron beam 101 is adjusted. Further, the specimen 13 is irradiated with the focused primary electron beam 101 deflected to arbitral position by the first, the second and the third deflectors 31, 32, 33. Furthermore, though the following scanning deflectors are not shown in FIG. 1, the primary electron beam 101 is scanned two-dimensionally on the specimen 13 by each of scanning deflectors arranged in an arbitrary position. Alternatively, a part or all of the first, the second and the third deflectors 31, 32, 33 can be used as the scanning deflectors to scan the primary electron beam 101 two-dimensionally on the specimen 13.

A signal electron 102 such as a secondary electron or a backscattered electron emitted from the specimen 13 irradiated by the primary electron beam 101 is deflected by the ExB deflector 52 that acts so as to deflect only the signal electron, and after the signal electron hits a reflector 53, the detector 51 detects tertiary electrons and the backscattered electrons emitted from the reflector. The signal electron 102 detected by the detector 51 is processed by the arithmetic device 81. A two-dimensional image corresponding to the position in which the primary electron beam 101 irradiates is displayed by the input-output device 83.

The storage 82 stores a program for realizing a control module 90. In addition, the storage 82 stores parameter information 99. The storage 82 holds a program and information respectively not shown. For example, the storage 82 stores positional information showing a measured location of the specimen 13, a measurement condition and others.

The control module 90 controls each component of the electro-optical column 1 via each power source of the power unit 2. The control module 90 includes a setting module 91 of deflection field for movement of FOV and a setting module 92 of deflection field for control of signal electron. The parameter information 99 contains the value used when the setting module 91 of deflection field for movement of FOV and the setting module 92 of deflection field for control of signal electron determine the strength of the respective deflectors.

The setting module 91 of deflection field for movement of FOV is provided with a function for determining the strength of the respective deflectors when a deflection field for moving a scanning area of the primary electron beam 101 on the specimen 13 is formed using the first, the second and the third deflectors 31, 32, 33. In the electro-optical column 1 shown in FIG. 1, the setting module 91 of deflection field for movement of FOV acquires a desired movement amount of FOV by operating the first, the second and the third deflectors 31, 32, 33 according to operating ratio stored of respective deflectors in the parameter information 99.

The setting module 92 of deflection field for control of signal electron is provided with a function for determining the strength of the respective deflectors so as to keep constant the scanning area on the specimen 13 by the primary electron beam 101 even if the primary electron beam 101 is deflected using the first, the second and the third deflectors 31, 32, 33. In the electro-optical column 1 shown in FIG. 1, when the strength of the respective deflector is varied, the setting module 92 of deflection field for control of signal electron prevents movement of FOV even if the strength of the deflector is varied by operating the first, the second and the third deflectors 31, 32, 33 according to the operating ratio of the respective deflectors stored in the parameter information 99.

Figure 2:
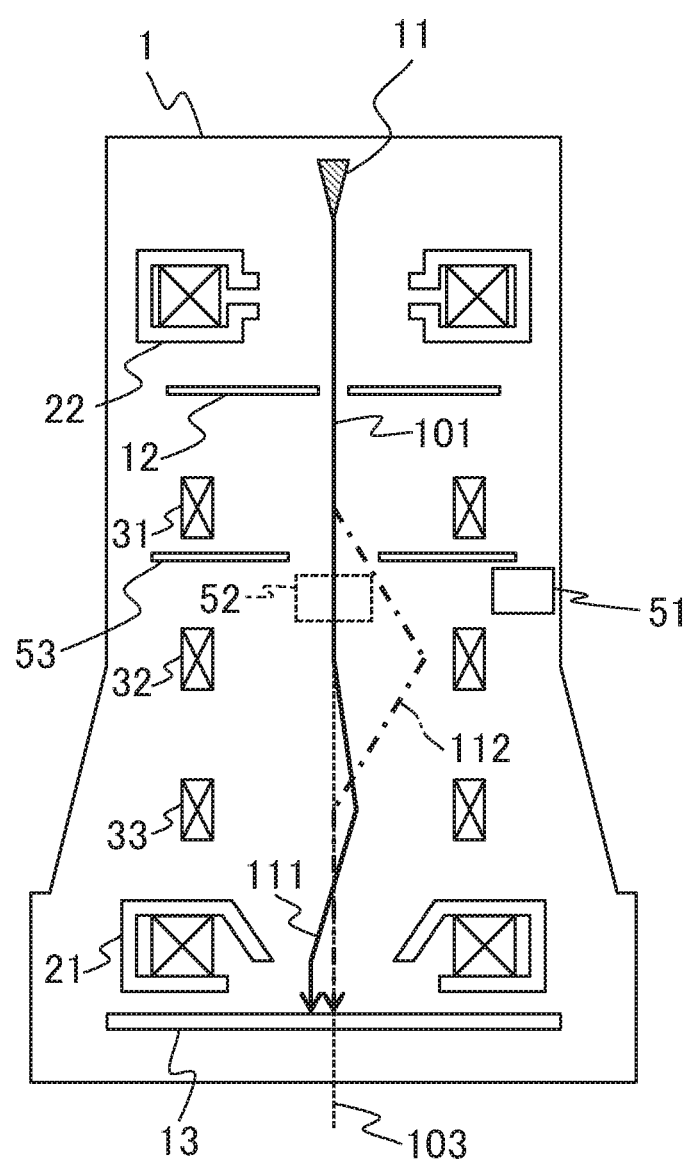
FIG. 2 is a schematic diagram showing a primary electron trajectory in the first embodiment.

FIG. 2 is a schematic diagram showing a primary electron trajectory 111 (the solid line) acquired by deflecting the primary electron beam 101 according to setting by the setting module 91 of deflection field for movement of FOV and a primary electron trajectory 112 (the alternate long and short dash line) acquired by deflecting the primary electron beam 101 according to setting by the setting module 92 of deflection field for control of signal electron in the electro-optical column 1. To simplify, the setting module 91 of deflection field for movement of FOV operates the second and the third deflectors 32, 33 without operating the first deflector 31 and realizes movement of the scanning area by the primary electron beam on the specimen 13. However, in FIG. 2, only the trajectories of the primary beam vertically radiated from the electron source 11 toward the specimen 13 are shown. When the primary electron beam 101 is not deflected by the deflector, the primary electron beam passes perpendicularly from the electron source 11, that is, on an axis 103 extended toward the center of the objective lens 21 and reaches the specimen 13 without being refracted by the objective lens 21.

As for the primary electron trajectory 111 set by the setting module 91 of deflection field for movement of FOV, the primary beam 101 is deflected outside the axis 103 in the position of the second deflector 32 and is swung back in the position of the third deflector 33, and afterwards the primary beam is refracted by the objective lens 21 and irradiates the specimen 13 deviated from the axis 103.

As for the primary electron trajectory 112 set by the setting module 92 of deflection field for control of signal electron, the primary beam 101 is deflected outside the axis 103 in the position of the first deflector 31 and is swung back by the second deflector 32, and afterwards the primary beam is deflected to return onto the axis 103 by the third deflector 33 and irradiates the specimen 13 through the objective lens 21 along the axis 103. At this time, as the primary electron trajectory 112 passes the objective lens on the axis 103, the primary beam irradiates the specimen without being refracted by the objective lens and a state in which a measurement visual field is unchanged even if the primary electron beam is deflected can be realized.

The setting module 91 of deflection field for movement of FOV and the setting module 92 of deflection field for control of signal electron can be used simultaneously. Setting values for the first, the second and the third deflectors 31, 32, 33 at this time are equivalent to the value acquired by adding the setting value for each deflector set by the setting module 91 of deflection field for movement of FOV and the setting value for each deflector set by the setting module 92 of deflection field for control of signal electron. At this time, the position of the primary beam on the specimen 13 when respective deflection fields are added is equivalent to the position of the primary electron trajectory 111 on the specimen 13 because the primary electron trajectory 112 using the setting module 92 of deflection field for control of signal electron does not move FOV.

Figure 3:
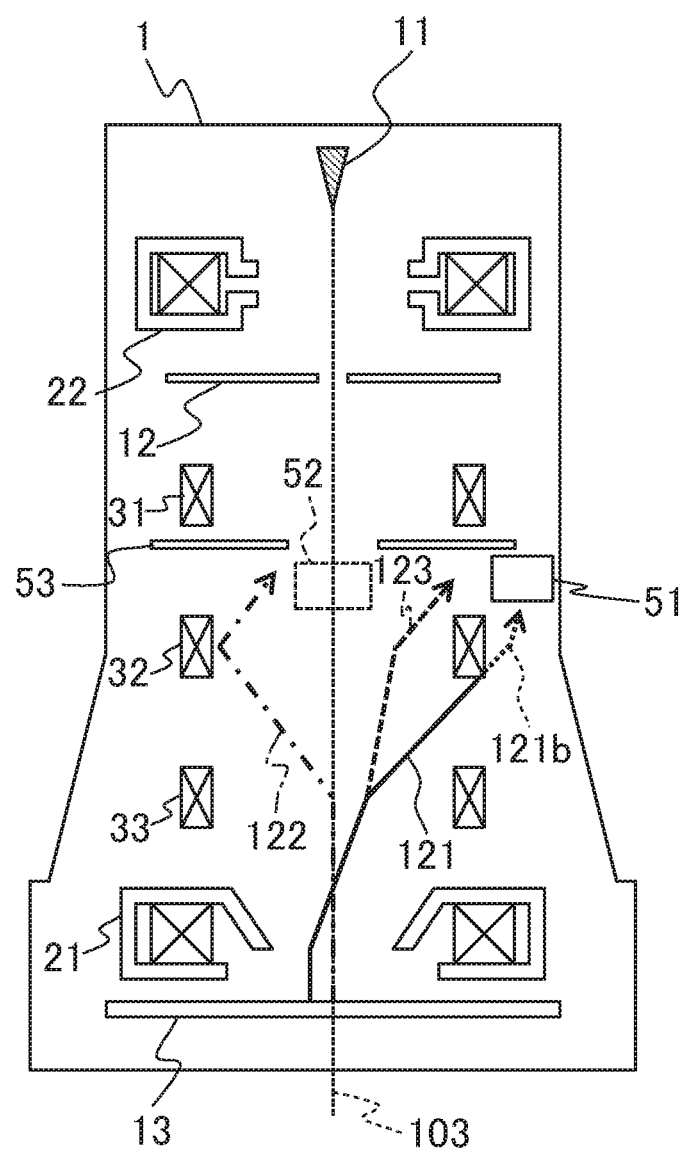
FIG. 3 is a schematic diagram showing a signal electron trajectory in the first embodiment.

FIG. 3 is a schematic diagram showing a signal electron trajectory 121 (the solid line) when the setting module 91 of deflection field for movement of FOV in the electro-optical column 1 is used, a signal electron trajectory 122 (the alternate long and short dash line) when the setting module 92 of deflection field for control of signal electron is used and a signal electron trajectory 123 (the dotted line) when the setting module 91 of deflection field for movement of FOV and the setting module 92 of deflection field for control of signal electron are used simultaneously. In this case, only the trajectories of signal electrons vertically emitted onto the specimen 13 are shown.

The signal electron trajectory 121 (the solid line) when the setting module 91 of deflection field for movement of FOV is used is bent by refractive action of the objective lens 21 after outgoing from the position in which the primary electron trajectory 111 (see FIG. 2) irradiates the specimen 13 and is deflected in the position of the third deflector 33. As the third deflector 33 generates a magnetic field, a signal electron is deflected the direction opposite to the primary electron in the point of view on the deflector. As a result, the signal electron trajectory 121 is deflected to the direction further deviated from the axis, in a case shown in FIG. 3, the signal electron collides with the second deflector 32, and the signal electron does not reach the detector 51. A collision position of the signal electron is not limited to the second deflector 32, and for example, collision with the third deflector 33 and collision with structure when the structure is arranged on the specimen side of the detector 51 though the structure is not shown are probable. A signal electron trajectory 121 when the signal electron collides with no structure is shown as a broken line 121*b*. As shown in FIG. 2, the second deflector 32 is also a magnetic-field deflector and deflects primary electron opposite direction to the third deflector 33. Therefore the second deflector 32 deflects the signal electrons opposite direction to the third deflector 33.

In this embodiment, the signal electron trajectory is corrected by using both the setting module 91 of deflection field for movement of FOV and the setting module 92 of deflection field for control of signal electron so as to prevent the signal electron from colliding with the structure in the electro-optical column 1. As described above, according to the setting values of the deflectors by the setting module 92 of deflection field for control of signal electron, the primary electron is deflected outside the axis 103 by the first deflector 31, the primary electron is swung back by the second deflector 32, further, the primary electron is swung back again by the third deflector 33, and the primary electron trajectory is returned onto the axis 103. Therefore, even if the setting module 91 of deflection field for movement of FOV and the setting module 92 of deflection field for control of signal electron are used simultaneously, the landing position of the primary electron beam on the specimen is kept constant. However, signal electron is deflected to the direction opposite to primary electron by magnetic deflector. As a result, the signal electron trajectory 123 can be differentiated from the signal electron trajectory 121.

Specifically, the signal electron trajectory 122 (the alternate long and short dash line) when only the setting module 92 of deflection field for control of signal electron is used without the setting module 91 of deflection field for movement of FOV passes the objective lens 21 after deviating from the axis 103 on the specimen 13, and the signal electron trajectory is deflected by the third and the second deflectors 33, 32. As a result, the signal electron trajectory 123 when the setting module 91 of deflection field for movement of FOV and the setting module 92 of deflection field for control of signal electron are used simultaneously follows the same trajectory as the signal electron trajectory 121 up to the position of the third deflector 33. The signal electron trajectory 123 has an trajectory closer to the axis 103 than the signal electron trajectory 121 between the third deflector 33 and the second deflector 32 because deflective action of signal electron is equivalent to the sum of the setting value of the setting module 91 of deflection field for movement of FOV and the setting value of the setting module 92 of deflection field for control of signal electron, and signal electrons that reach the position of the detector 51 increase.

As described above, if the setting module 92 of deflection field for control of signal electron is used so that the third deflector 33 generates deflection field that acts in the direction opposite to the shift of the electron trajectory 121 in the XY plane, the signal electron trajectory 123 can be realized. For example, the setting value of the setting module 92 of deflection field for control of signal electron set so that the desired detection rate is achieved when the setting module 91 of deflection field for movement of FOV is the maximum in the range of control (that is, a setting value when a FOV is most deviated from the axis 103) is stored in the parameter information 99. As the signal electron trajectory has the trajectory closer to the axis 103 than the signal electron trajectory in a case that movement by beam deflection is maximum in an operational range in the movement by beam deflection when the setting module 91 of deflection field for movement of FOV and the setting module 92 of deflection field for control of signal electron are operated at these setting values, the detection rate can be increased independent of the deflection amount.

Figure 4:
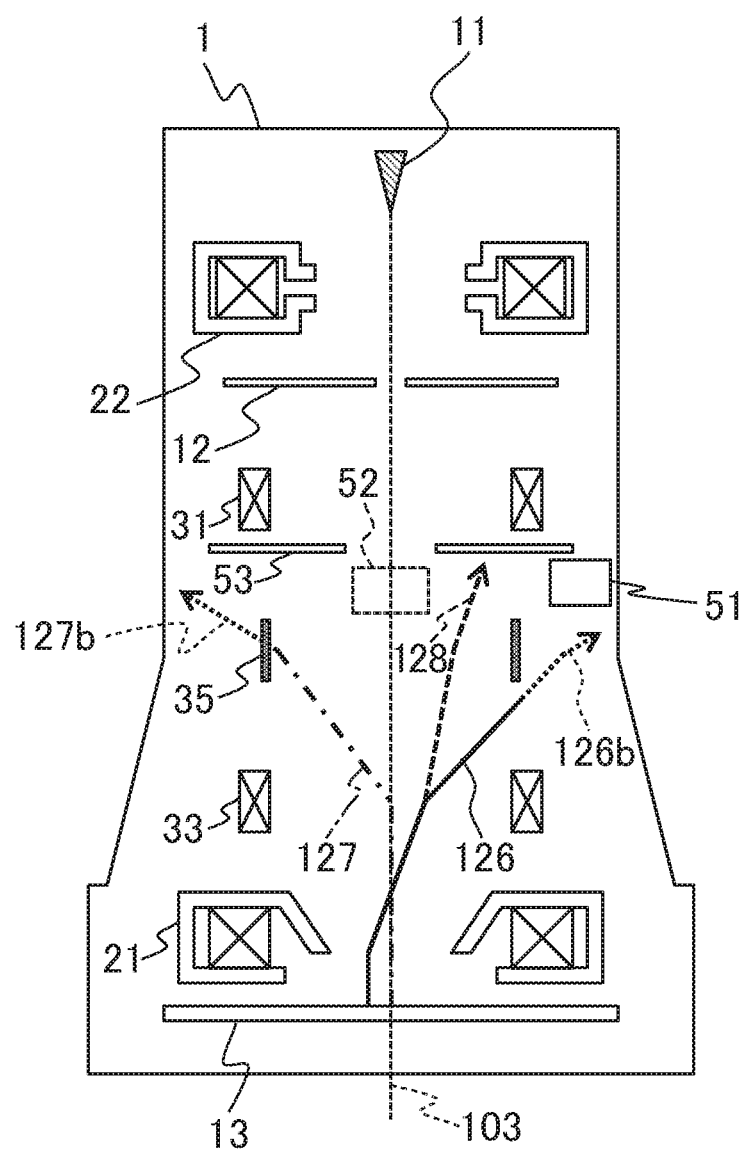
FIG. 4 is a schematic diagram showing another signal electron trajectory in the first embodiment.

In the configuration example of the scanning electron microscope shown in FIGS. 1 to 3, the first to the third deflectors all use a magnetic field; however, they can also be configured by a deflector using an electrostatic field. FIG. 4 shows signal electron trajectories in an electro-optical column 1 provided with electrostatic deflectors. In FIG. 4, the deflector 32 using a magnetic field shown in FIG. 3 is replaced with the deflector 35 using an electrostatic field. The second deflector 35 is different from the second deflector 32 in that it is operated by a power source for controlling voltage though the above-mentioned is not shown in FIG. 4; however, the other configuration is the same as the above-mentioned configuration. As electrons are deflected in a direction of positive potential independent of a direction in which the electrons enter the deflector in the deflector using an electrostatic field, both a primary electron and a signal electron are deflected to the same direction in the point of view on the deflector. Accordingly, a signal electron trajectory 126 (the solid line) when the setting module 91 of deflection field for movement of FOV is used, a signal electron trajectory 127 (the alternate long and short dash line) when the setting module 92 of deflection field for control of signal electron is used and a signal electron trajectory 128 when the setting module 91 of deflection field for movement of FOV and the setting module 92 of deflection field for control of signal electron are used simultaneously (the dotted line; however, the signal electron trajectory 128 is common to the signal electron trajectory 126 until the signal electron trajectory 128 is branched from the signal electron trajectory 126) are deflected opposite directions to the signal electron trajectory 121 in FIG. 3, the signal electron trajectory 122 in FIG. 3 and the signal electron trajectory 123 in FIG. 3 at the second deflector 35. When the second deflector consists of magnetic deflector, the signal electron trajectory 123 after passing the second deflector may deviate from the axis. However, by replacing the second deflector with electrostatic deflector, the signal electron trajectory can be deflected close to the axial and detection rate of signal electrons can be increased compared with the case that the second deflector is configured by the magnetic deflector. As in FIG. 3, a trajectory when the signal electron trajectory 126 collides with no structure is shown by a broken line 126b and a trajectory when the signal electron trajectory 127 collides with no structure is shown by a broken line 127b.

In the configuration shown in FIGS. 1 to 3, the detector 51 is arranged between the first deflector 31 and the second deflector 32. The reason is that as the signal electron trajectory 122 when the setting module 92 of deflection field for control of signal electron is used follows the axis 103 on the side of not the first deflector 31 but the electron source 11 in the case that the detector 51 is arranged on the side of not the first deflector 31 but the electron source 11, effect that the setting module 92 of deflection field for control of signal electron is used and the signal electron trajectory is modified is lost. This is also similar when the first deflector 31, the second deflector 32 and the third deflector 33 respectively configured by the magnetic deflector in FIG. 3 are all replaced with the electrostatic deflectors. In the meantime, as in the configuration shown in FIG. 4, as directionality of action upon the signal electron trajectories is different between the magnetic deflector and the electrostatic deflector when the first and the third deflectors 31, 33 being the magnetic deflector and the second deflector 35 being the electrostatic deflector coexist, effect that the setting module 92 of deflection field for control of signal electron is used and the signal electron trajectory is modified is acquired even if detector 51 is arranged on the side of not the first deflector 31 but the electron source 11. However, in this case, from a viewpoint of a degree of freedom in optical design, it is also desirable that the detector 51 is arranged on the side of not the first deflector 31 but the stage (the specimen).

As described above, a range of movement by beam deflection can be enlarged by avoiding the collision with the structure in the electro-optical column 1 of the signal electron trajectory, suppressing a deterioration of the signal electrons detection rate according to move by beam deflection.

Second Embodiment

Figure 5:
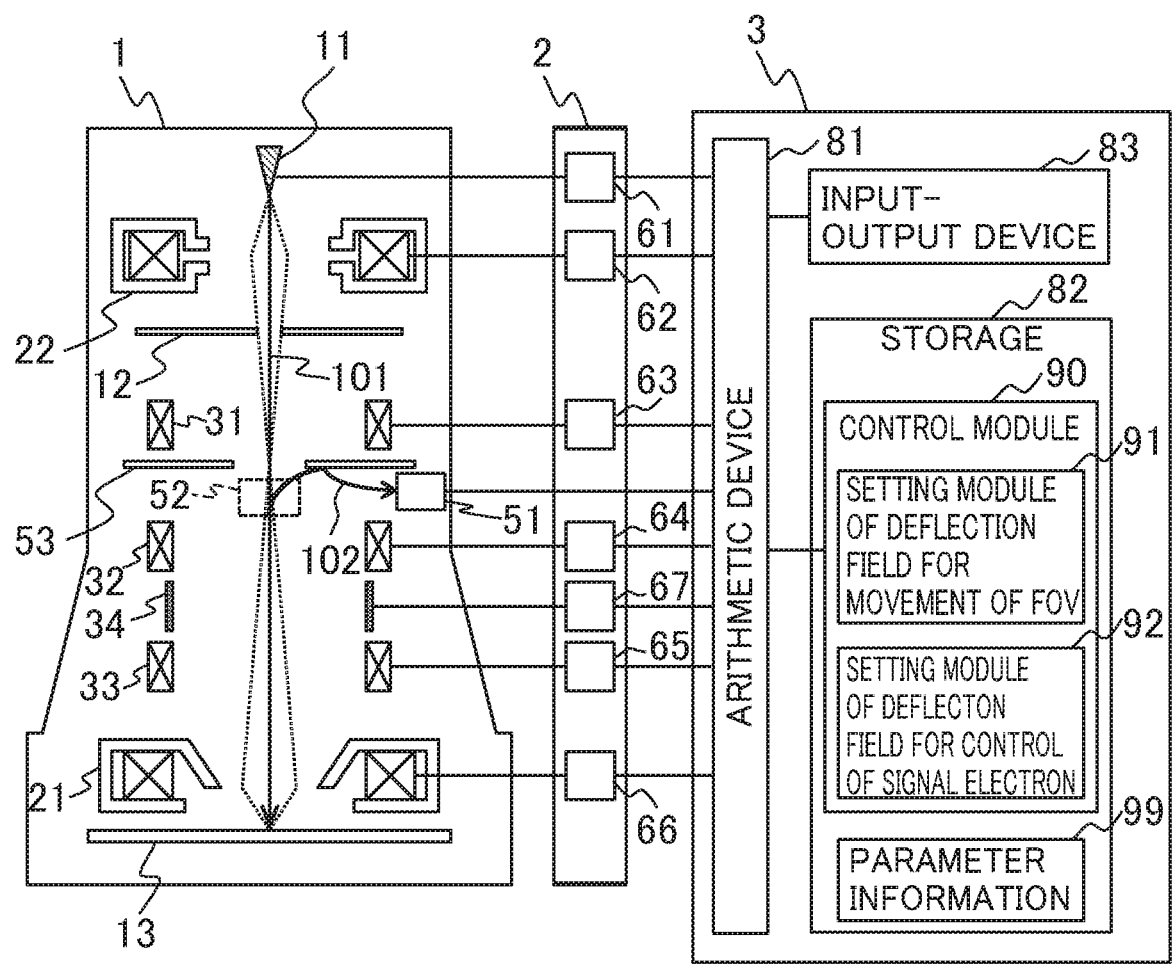
FIG. 5 is a schematic diagram showing an overall constitution of a scanning electron microscope equivalent to a second embodiment.

FIG. 5 is a schematic diagram showing an overall constitution of a scanning electron microscope equivalent to a second embodiment. A fourth deflector 34 is added in an electro-optical column 1 and a control power source 67 is added in a power unit 2 in addition to the configuration shown in FIG. 1 in the first embodiment. The fourth deflector 34 uses an electrostatic field and the control power source 67 controls voltage applied to the fourth deflector 34. In FIG. 5, the fourth deflector 34 is arranged in a different position from a second deflector 32; however, the second deflector 32 and the fourth deflector 34 may also be arranged so that apart of deflection fields of the second and the fourth deflectors 32, 34 is superimposed. In addition, a setting module 91 of deflection field for movement of FOV is provided with a function for determining the strength of respective deflectors when deflection fields for movement a scanning area on a specimen 13 of a primary electron beam 101 are generated by a first deflector 31, the second deflector 32, a third deflector 33 and the fourth deflector 34. Moreover, a setting module 92 of deflection field for control of signal electron is provided with a function for determining the strength of the respective deflectors so as to keep constant a position of the scanning area on the specimen 13 of the primary electron beam 101 even if the strength of the first, the second, the third and the fourth deflectors 31, 32, 33, 34 is varied. As the other configuration is the same as that in the first embodiment, its description is omitted.

Figure 6:
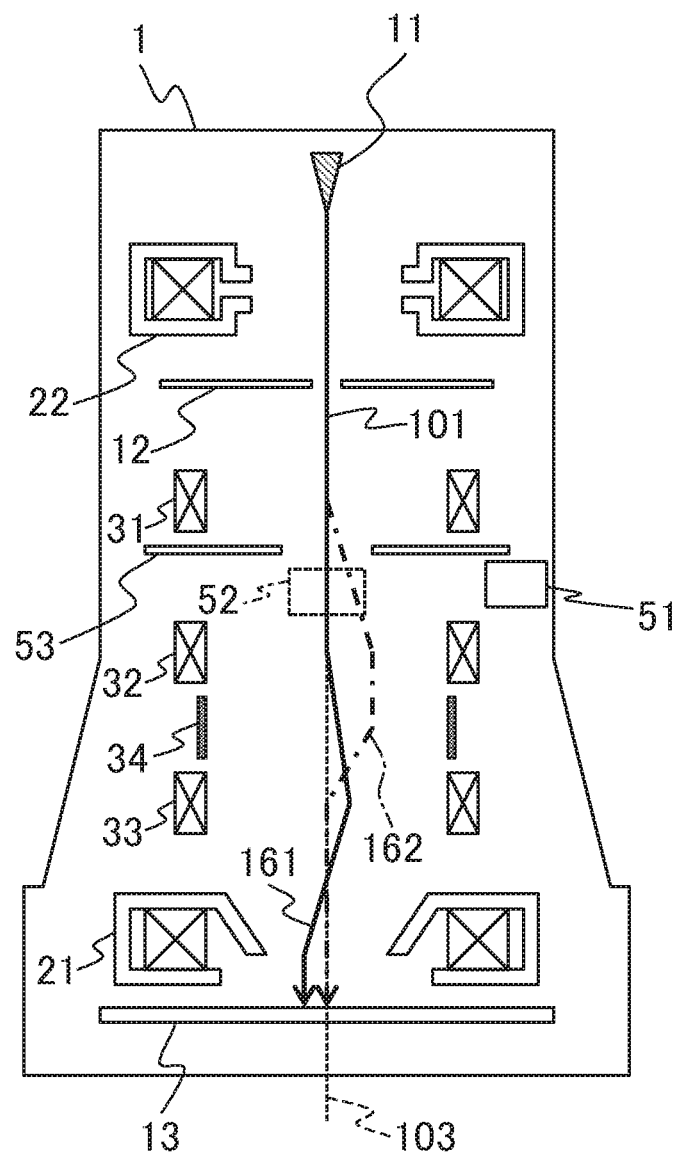
FIG. 6 is a schematic diagram showing a primary electron trajectory in the second embodiment.

FIG. 6 is a schematic diagram showing a primary electron trajectory 161 (the solid line) acquired by deflecting the primary electron beam 101 using the setting module 91 of deflection field for movement of FOV and a primary electron trajectory 162 (the alternate long and short dash line) acquired by deflecting the primary electron beam 101 using the setting module 92 of deflection field for control of signal electron in the electro-optical column 1. In this case, the setting module 91 of deflection field for movement of FOV operates the second deflector 32 and the third deflector 33 without operating the first deflector 31 and the fourth deflector 34 and realizes movement of the scanning area on the specimen 13 of the primary electron beam. That is, as the primary electron trajectory 161 is the same as the primary electron trajectory 111 in the first embodiment, its description is omitted.

The primary electron trajectory 162 set by the setting module 92 of deflection field for control of signal electron has an trajectory that the primary beam 101 is deflected outside the axis 103 in a position of the first deflector 31, is deflected to return to the axis 103 in the third deflector 33 after the primary beam is swung back in the second and the fourth deflectors 32, 34, the primary beam passes an objective lens 21 and the primary beam irradiates the specimen 13. In this case, the strength of the first, the second and the fourth deflectors 31, 32, 34 is set so that a trajectory after passing the fourth deflector 34 of the primary electron trajectory 162 is the same as the primary electron trajectory 112 in the first embodiment. Concretely, a deflection direction of the first deflector 31 and a deflection direction of the second deflector 32 respectively for the primary electron beam are opposite, and a deflection direction of the second deflector 32 and a deflection direction of the fourth deflector 34 are the same.

Figure 7:
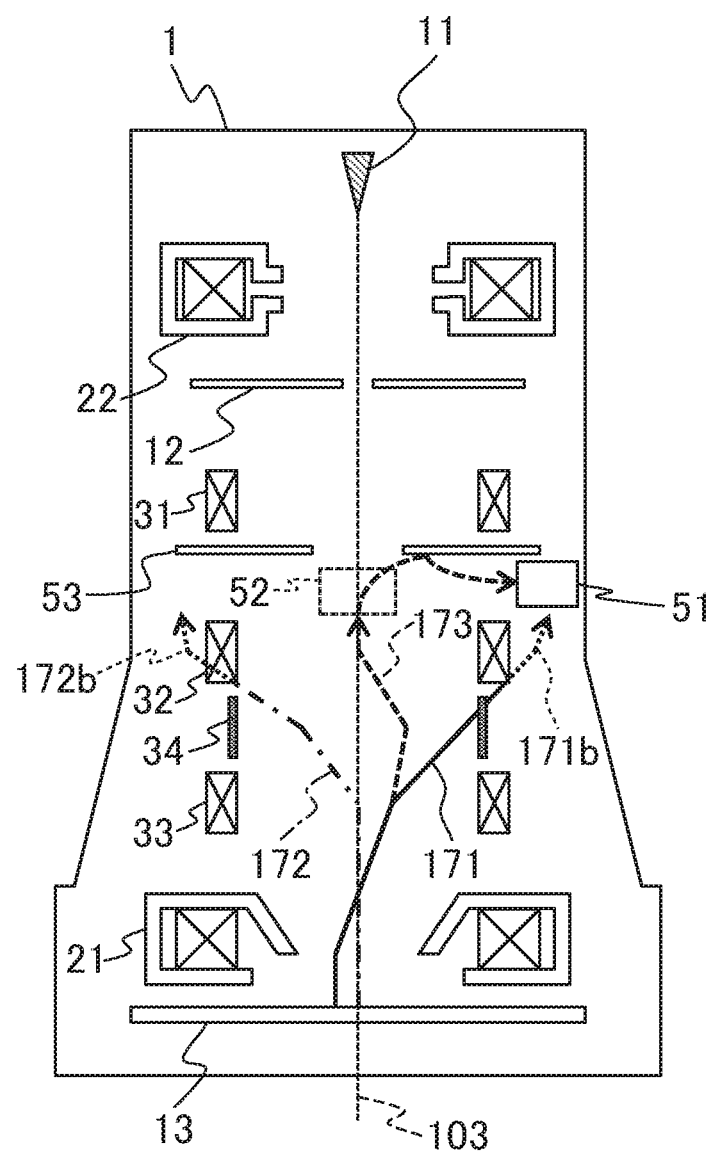
FIG. 7 is a schematic diagram showing a signal electron trajectory in the second embodiment.

FIG. 7 is a schematic diagram showing a signal electron trajectory 171 (the solid line) when the setting module 91 of deflection field for movement of FOV is used, a signal electron trajectory 172 (the alternate long and short dash line) when the setting module 92 of deflection field for control of signal electron is used and a signal electron trajectory 173 (the dotted line) when the setting module 91 of deflection field for movement of FOV and the setting module 92 of deflection field for control of signal electron are used simultaneously in the electro-optical column 1.

The signal electron trajectory 171 using the setting module 91 of deflection field for movement of FOV is the same as the signal electron trajectory 121 in the first embodiment. Similarly, a trajectory when the signal electron trajectory 171 collides with no structure is shown by a broken line 171b. The signal electron trajectory 172 using the setting module 92 of deflection field for control of signal electron is the same as the signal electron trajectory 122 in the first embodiment up to a position of the fourth deflector 34 and the signal electron trajectory is deflected by the fourth deflector 34. The fourth deflector 34 uses an electrostatic field, and as the signal electron trajectory is the same as the deflection direction of the primary electron beam in view of the deflector as structure, the signal electron trajectory 172 has an trajectory deflected further outside the axis, compared with the signal electron trajectory 122 in the first embodiment and has the trajectory that collides with the second deflector 32 in a case shown in FIG. 7. When the signal electron trajectory 172 collides with no structure, the signal electron trajectory is deflected in an opposite direction to deflective action by the third deflector 33 in a position of the second deflector 32 as shown by a broken line 172b.

The signal electron trajectory 173 when the setting module 91 of deflection field for movement of FOV and the setting module 92 of deflection field for control of signal electron are used simultaneously follows the same trajectory as the signal electron trajectory 123 in the first embodiment up to the position of the fourth deflector 34. A deflection direction of a signal electron in the fourth deflector 34 is opposite to the shift of the signal electron trajectory 171 in the XY plane after passing the third deflector 31. Therefore the signal electron trajectory 171 is deflected further closer to the axis 103 than the signal electron trajectory 123 in the first embodiment. When the signal electron trajectory 173 reaches the position of the second deflector 32, it is deflected by the second deflector 32. As shown in FIG. 7, a position of a signal electron that travels to a position of an ExB deflector 52 can be approached to a position of a signal electron passing when the beam is not reflected as shown in FIG. 1.

As described above, the collision of the signal electron trajectory with the structure in the electro-optical column 1 is avoided, variation of the detection rate of signal electrons according to movement by beam deflection is further reduced, and the range of movement by beam deflection can be enlarged.

Third Embodiment

A third embodiment enhances a degree of freedom in control by providing a deflector used for only generating a signal electron deflection field and a deflector used for only generating a deflection field for movement for FOV, compared with the second embodiment.

Figure 8:
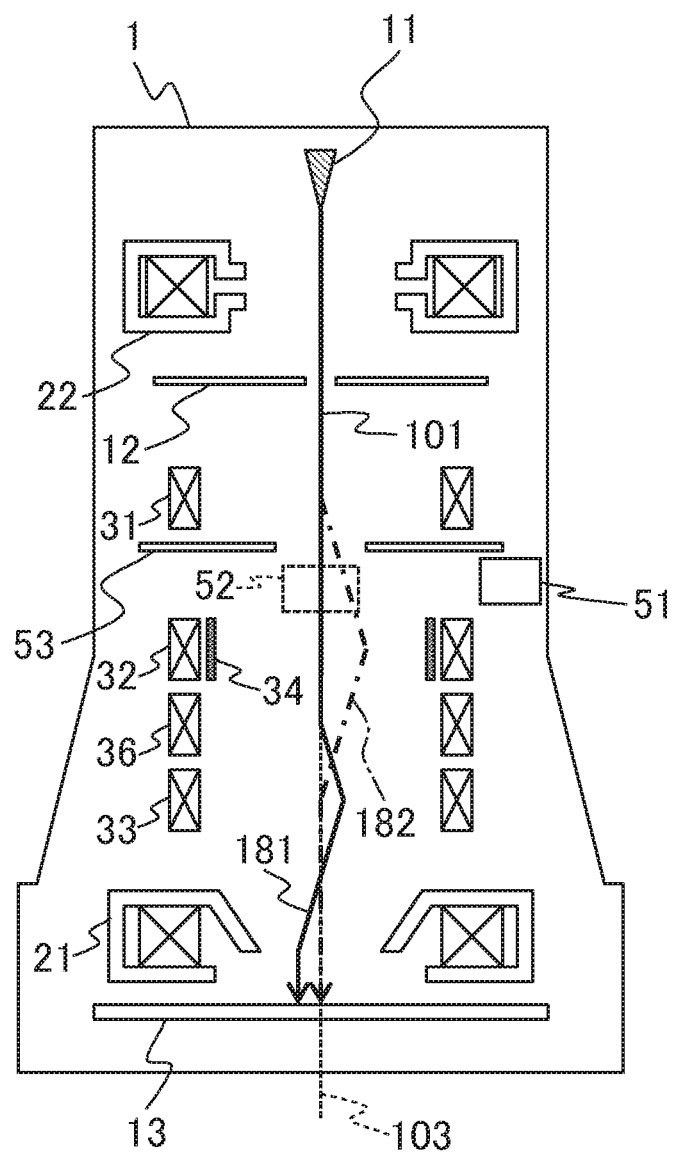
FIG. 8 is a schematic diagram showing a primary electron trajectory in a third embodiment.

FIG. 8 is a schematic diagram showing a primary electron trajectory 181 (the solid line) acquired by deflecting a primary electron beam 101 using the setting module 91 of deflection field for movement of FOV and a primary electron trajectory 182 (the alternate long and short dash line) acquired by deflecting the primary electron beam 101 using the setting module 92 of deflection field for control of signal electron respectively in an electro-optical column 1. In FIG. 8, the trajectories of a primary beam vertically emitted from an electron source 11 toward a specimen 13 are shown. In addition, a fifth deflector 36 uses a magnetic field, the fifth deflector is connected to a control power source (not shown) that controls current applied to a coil as in other magnetic-field deflectors, and the control power source is controlled by an arithmetic device 81.

A third deflector 33 and the fifth deflector 36 are operated according to each setting value by the setting module 91 of deflection field for movement of FOV. Moreover, a first deflector 31, a second deflector 32, the third deflector 33 and a fourth deflector 34 are operated according to each setting value by the setting module 92 of deflection field for control of signal electron. The other configuration is the same as the configuration shown in FIG. 5.

The primary electron trajectory 181 set by the setting module 91 of deflection field for movement of FOV has an trajectory that the primary beam 101 is deflected outside an axis 103 in a position of the fifth deflector 36, the primary beam is refracted by action of the objective lens 21 after the primary beam is swung back in a position of the third deflector 33 and the primary beam irradiates the specimen 13 outside the axis 103.

The primary electron trajectory 182 set by the setting module 92 of deflection field for control of signal electron has an trajectory that the primary beam 101 is deflected outside the axis 103 in a position of the first deflector 31, the primary beam is deflected to return to the axis 103 by the third deflector 33 after it is swung back by the second and the fourth deflectors 32, 34 and the primary beam irradiates the specimen 13 through the objective lens 21. In this case, the second deflector 32 and the fourth deflector 34 generate deflective action upon the primary beam in the same direction and are operated at such ratio that the primary electron trajectory 182 passes on the axis in the position of the third deflector 33.

As in the first and second embodiments, the setting module 91 of deflection field for movement of FOV and the signal electron defective field setting module 92 can be used simultaneously. A position in which the primary beam irradiates the specimen 13 at this time is the same as a position in which the primary electron trajectory 181 deflected by the setting module 91 of deflection field for movement of FOV reaches the specimen 13 as in the other embodiments.

Figure 9:
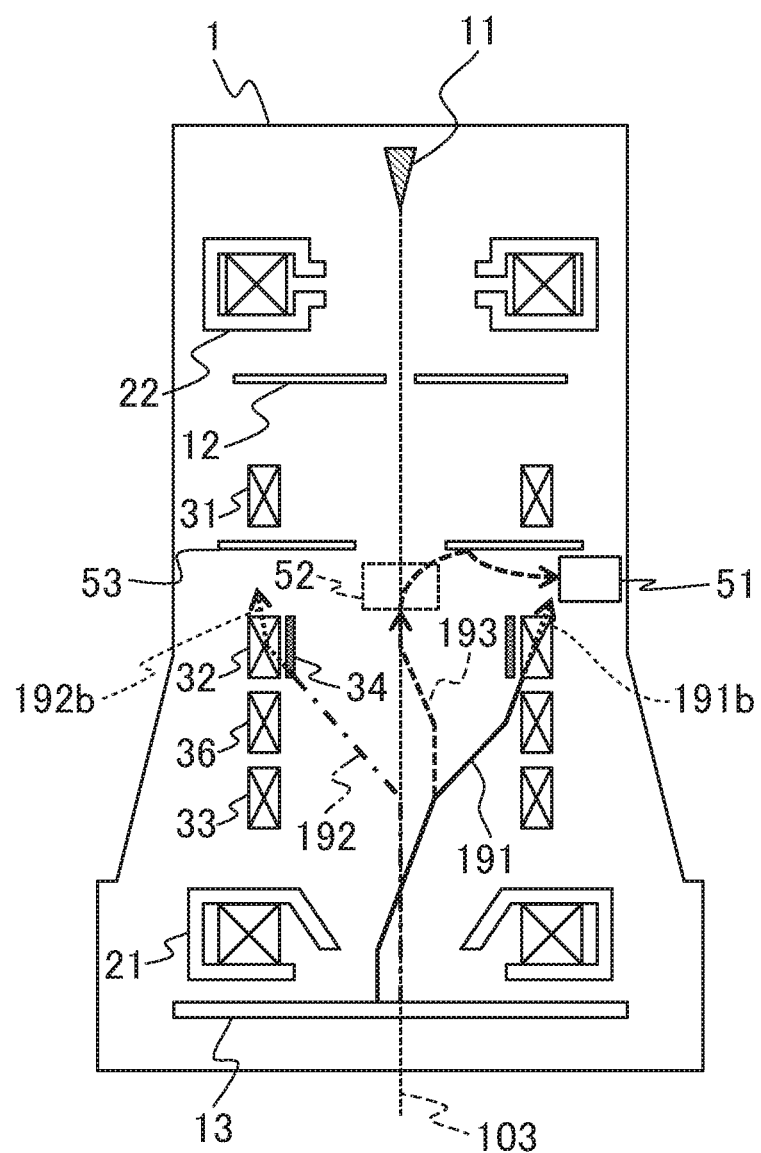
FIG. 9 is a schematic diagram showing a signal electron trajectory in the third embodiment.

FIG. 9 is a schematic diagram showing a signal electron trajectory 191 (the solid line) when the setting module 91 of deflection field for movement of FOV in the electro-optical column 1 is used, a signal electron trajectory 192 (the alternate long and short dash line) when the setting module 92 of deflection field for control of signal electron is used and a signal electron trajectory 193 (the dotted line) when the setting module 91 of deflection field for movement of FOV and the setting module 92 of deflection field for control of signal electron are used simultaneously.

The signal electron trajectory 191 when the setting module 91 of deflection field for movement of FOV is used is refracted by refractive action of the objective lens 21 after outgoing from the position in which the primary electron trajectory 181 reaches the specimen 13 and is respectively deflected in the position of the third deflector 33 and the position of the fifth deflector 36. As a direction in which a signal electron is deflected in the deflector using a magnetic field is similar to that in the above-mentioned embodiments, its description is omitted. A trajectory when the signal electron trajectory 191 collides with no structure is shown by a broken line 191*b*.

The signal electron trajectory 192 when the setting module 92 of deflection field for control of signal electron is used is deflected by the third deflector 33, the second deflector 32 and the fourth deflector 34 after passing the objective lens 21. A deflection direction of a signal electron passing positions of the second deflector 32 and the fourth deflector 34 can be arbitrarily modified in a range from a direction in a case that the signal electron is deflected by only the second deflector 32 to a direction in a case that the signal electron is deflected by only the fourth deflector 34 by setting operation ratio of the second deflector 32 and the fourth deflector 34. A method of setting the operation ratio of the second deflector 32 and the fourth deflector 34 will be described later.

The signal electron trajectory 193 when the setting module 91 of deflection field for movement of FOV and the setting module 92 of deflection field for control of signal electron are used simultaneously follows the same trajectory as the signal electron trajectory 191 up to the position of the third deflector 33. The setting module 92 of deflection field for control of signal electron sets so that a signal electron passes on the axis 103 in the positions of the second and the fourth deflectors 32, 34.

The method of setting the operation ratio of the second deflector 32 and the fourth deflector 34 will be described below. When the signal electron passes cross to the axis 103 in the positions of the second and the fourth deflectors 32, 34, signal electron trajectory tilts to the optical axis 103. If the operation ratio of the second and the fourth deflectors 32, 34 is set at this time so that the signal electron travels along the optical axis 103, the signal electron enters in the ExB deflector 52 at the same trajectory as that in a state without using setting module 91 of deflection field for movement of FOV. As a result, the same detection rate as that in a case without movement of FOV by deflection even if movement of FOV by deflection is performed can be realized.

In this embodiment, the second deflector 32 using a magnetic field and the fourth deflector 34 using an electrostatic field are superimposed; however, even if the deflection fields are not superimposed as described in the second embodiment, the similar effect can be acquired. Further, an electrostatic field may also be used for the fifth deflector 36.

Hereby, the similar detection rate to that in the case without beam deflection is maintained even if movement of FOV by beam deflection is used without deteriorating the detection rate by collision with the structure before the signal electron reaches the detector, and the range of movement of FOV by beam deflection can be enlarged.

What is claimed is:

1. A scanning electron microscope, comprising:
an electron source;
a condenser lens and an objective lens respectively for focusing a primary electron beam emitted from the electron source on a specimen;
a plurality of deflectors that deflect the primary electron beam passing the condenser lens;
a detector that detects a signal electron emitted from the specimen by scanning the primary electron beam to the specimen; and
a processor that controls the electron source, the condenser lens, the objective lens and the plurality of deflectors,
wherein the processor is configured to execute a sequence of stored instructions which cause said processor to perform a first deflection field setting operation that sets the plurality of deflectors so as to move a scanning area on the specimen by the primary electron beam to a position deviated from an axis extended from the electron source toward the center of the objective lens and a second deflection field setting operation that sets the plurality of deflectors so as to correct trajectories of signal electrons without changing the scanning area of the primary electron beam set by the first deflection field setting operation; and
the processor controls the plurality of deflectors by adding a setting value set by the second deflection field setting operation to a setting value set by the first deflection field setting operation.

2. The scanning electron microscope according to claim 1, wherein the plurality of deflectors include first to third deflectors in order between the condenser lens and the objective lens; and
the detector is located between the first deflector and the second deflector.

3. The scanning electron microscope according to claim 2, wherein the first to third deflectors are a deflector using a magnetic field or a deflector using an electrostatic field.

4. The scanning electron microscope according to claim 1, wherein the setting value set by the second deflection field setting operation is set in such a manner that a detection rate of signal electrons by the detector is a predetermined detection rate when the first deflection field setting operation takes a setting value at which the scanning area of the primary electron beam is moved to the farthest position from the axis.

5. The scanning electron microscope according to claim 1, comprising:
an ExB deflector and a reflector on the axis, wherein the detector detects an electron emitted from the reflector when the signal electron deflected by the ExB deflector collides with the reflector; and when the processor controls the plurality of deflectors by adding the setting value set by the second deflection field setting operation to the setting value set by the first deflection field setting operation, the signal electron is incident on the electron beam deflector along the axis as a result.

6. The scanning electron microscope according to claim 1, wherein the plurality of deflectors are controlled according to the setting value by the first deflection field setting operation, the second deflection field setting operation, and an added value of the setting value by the first deflection field setting operation and the setting value by the second deflection field setting operation.

7. A scanning electron microscope, comprising:
an electron source;
a condenser lens and an objective lens respectively for focusing a primary electron beam emitted from the electron source;
a plurality of deflectors that deflect the primary electron beam passing the condenser lens;
a detector that detects a signal electron emitted from the specimen by scanning the primary electron beam to the specimen; and
a processor that controls the electron source, the condenser lens, the objective lens and the plurality of deflectors,
wherein the processor configured to execute a sequence of stored instructions which cause said processor to perform a first deflection field setting operation that sets the plurality of deflectors so as to move a scanning area on the specimen of the primary electron beam to a position deviated from an axis extended from the electron source toward the center of the objective lens and a second deflection field setting operation that sets the plurality of deflectors in such a manner that an trajectory of the primary electron beam includes a first trajectory portion deviated from the axis and a second trajectory portion passing the objective lens along the axis; and the processor controls the plurality of deflectors by adding a setting value set by the second deflection field setting operation to a setting value set by the first deflection field setting operation.

8. The scanning electron microscope according to claim 7, wherein the plurality of deflectors include first to third deflectors in order between the condenser lens and the objective lens; and
the detector is located between the first deflector and the second deflector.

9. The scanning electron microscope according to claim 8, wherein the first to the third deflectors is a deflector using a magnetic field or a deflector using an electrostatic field.

10. The scanning electron microscope according to claim 7, wherein the setting value of the second deflection field setting operation is set in such a manner that a detection rate of signal electrons by the detector is a predetermined detection rate when the first deflection field setting operation takes a setting value at which the scanning area of the primary electron beam is moved to the farthest position from the axis.

11. The scanning electron microscope according to claim 7, comprising:
an electron beam deflector and a reflector on the axis,
wherein the detector detects an electron generated by collision of the primary electron deflected by the electron beam deflector with the reflector; and
when the processor controls the plurality of deflectors by adding the setting value set by the second deflection field setting operation to the setting value set by the first deflection field setting operation, the signal electron is incident on the electron beam deflector along the axis as a result.

12. The scanning electron microscope according to claim 7, wherein the plurality of deflectors are controlled according to the setting value by the first deflection field setting operation, the second deflection field setting operation, and an added value of the setting value by the first deflection field setting operation and the setting value by the second deflection field setting operation.

* * * * *